(12) United States Patent
Tokeshi et al.

(10) Patent No.: US 11,920,879 B2
(45) Date of Patent: Mar. 5, 2024

(54) HEAT DISSIPATION DEVICE AND COOLING DEVICE

(71) Applicant: Nidec Corporation, Kyoto (JP)

(72) Inventors: Toshihiko Tokeshi, Kyoto (JP); Genki Horiguchi, Kyoto (JP); Takehito Tamaoka, Kyoto (JP); Takaya Okuno, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 17/899,696

(22) Filed: Aug. 31, 2022

(65) Prior Publication Data
US 2023/0069806 A1 Mar. 2, 2023

(30) Foreign Application Priority Data

Sep. 1, 2021 (JP) .................................. 2021-142734

(51) Int. Cl.
*F28F 9/26* (2006.01)
*F04D 13/14* (2006.01)
*F04D 29/58* (2006.01)
*H01L 23/473* (2006.01)

(52) U.S. Cl.
CPC .............. *F28F 9/262* (2013.01); *F04D 13/14* (2013.01); *F04D 29/586* (2013.01); *F28F 2250/08* (2013.01); *H01L 23/473* (2013.01)

(58) Field of Classification Search
CPC .... F04D 13/14; F04D 29/586; F28D 1/05383; F28D 2021/0031; F28F 9/262; F28F 2250/08; H01L 23/473; H05K 7/20263; H05K 7/20272
See application file for complete search history.

(56) References Cited

U.S. PATENT DOCUMENTS

| 10,048,008 | B1 * | 8/2018 | Mounioloux | ........ F28D 1/05366 |
|---|---|---|---|---|
| 10,431,524 | B1 * | 10/2019 | Lan | .......................... F28D 1/035 |
| 2005/0088820 | A1 * | 4/2005 | Naganawa | ........... F28D 1/05341 |
| | | | | 257/E23.098 |
| 2006/0137863 | A1 * | 6/2006 | Lee | ........................ H01L 23/473 |
| | | | | 361/699 |
| 2009/0044929 | A1 * | 2/2009 | Yeh | .......................... F28D 15/00 |
| | | | | 165/104.19 |
| 2013/0299139 | A1 * | 11/2013 | Mounioloux | ........ F28D 1/05375 |
| | | | | 165/120 |
| 2016/0234968 | A1 * | 8/2016 | Huang | ................... H01L 23/427 |

(Continued)

*Primary Examiner* — Eric S Ruppert
*Assistant Examiner* — Hans R Weiland
(74) *Attorney, Agent, or Firm* — Keating & Bennett, LLP

(57) ABSTRACT

A heat dissipation device includes a radiator, a first tank, and a pump assembly. The radiator cools liquid and extends in a first direction. The first tank is connected to the radiator, and the liquid passes through the first tank. The pump assembly is connected to the first tank and circulates the liquid flowing in from the first tank. The radiator includes a pipe through which the liquid passes. The pipe extends along the first direction. The pump assembly is located on one side in the first direction of the radiator. The pump assembly includes a first pump, a second pump, and a flow path portion. The first pump feeds and circulates the liquid. The second pump feeds and circulates the liquid. The flow path portion guides the liquid fed from the first pump and the second pump toward an outside of the pump assembly.

12 Claims, 10 Drawing Sheets

(56) References Cited

U.S. PATENT DOCUMENTS

| | | | |
|---|---|---|---|
| 2016/0338223 A1* | 11/2016 | Tsai | F28F 3/12 |
| 2017/0055370 A1* | 2/2017 | Tsai | H01L 23/473 |
| 2017/0115708 A1* | 4/2017 | Tivadar | H05K 7/20263 |
| 2018/0308786 A1* | 10/2018 | Huang | H01L 23/467 |
| 2019/0090384 A1* | 3/2019 | Xiao | F28F 1/126 |
| 2019/0239388 A1* | 8/2019 | Tsai | H05K 7/20254 |
| 2020/0236807 A1* | 7/2020 | Deng | F28F 27/02 |
| 2021/0385969 A1* | 12/2021 | Geng | H05K 7/20272 |
| 2022/0071058 A1* | 3/2022 | Chen | F28F 9/18 |
| 2022/0163264 A1* | 5/2022 | Duan | F28D 1/05375 |
| 2022/0170705 A1* | 6/2022 | Huang | F28F 9/0209 |

* cited by examiner

HEAT DISSIPATION DEVICE AND COOLING DEVICE

CROSS REFERENCE TO RELATED APPLICATION

The present application claims priority under 35 U.S.C. § 119 to Japanese Application No. 2021-142734, filed on Sep. 1, 2021, the entire contents of which are hereby incorporated herein by reference.

1. Field of the Invention

The present disclosure relates to a heat dissipation device and a cooling device.

2. Background

A conventional cooling device includes two centrifugal pumps for circulating a cooling medium between a cooling body and a radiator. One centrifugal pump is fixed to one end of the radiator in the longitudinal direction of the radiator. The other centrifugal pump is fixed to the other end of the radiator in the longitudinal direction of the radiator.

In the conventional cooling device, since the two centrifugal pumps are disposed at both ends of the radiator, the total length of the cooling device in the direction corresponding to the longitudinal direction of the radiator becomes long. That is, the proportion of the length of the components other than the radiator to the total length of the cooling device increases.

SUMMARY

A heat dissipation device according to an example embodiment of the present invention includes a radiator, a first tank, and a pump assembly. The radiator cools liquid and extends in a first direction. The first tank is connected to the radiator, and the liquid passes through the first tank. The pump assembly is connected to the first tank and circulates the liquid flowing in from the first tank. The radiator includes a pipe through which the liquid passes. The pipe extends along the first direction. The pump assembly is located on one side of the radiator in the first direction. The pump assembly includes a first pump, a second pump, and a flow path portion. The first pump feeds and circulates the liquid. The second pump feeds and circulates the liquid. The flow path portion guides the liquid fed from the first pump and the second pump toward an outside of the pump assembly.

A cooling device according to an example embodiment of the present invention includes a heat dissipation device, a cooling assembly, a first pipe, and a second pipe. The cooling assembly cools a heat source. The liquid flows through the first pipe, and the first pipe connects the pump assembly and the cooling assembly. The liquid flows through the second pipe, and the second pipe connects the cooling assembly and the radiator.

The above and other elements, features, steps, characteristics and advantages of the present disclosure will become more apparent from the following detailed description of the example embodiments with reference to the attached drawings.

DETAILED DESCRIPTION

Figure 1:
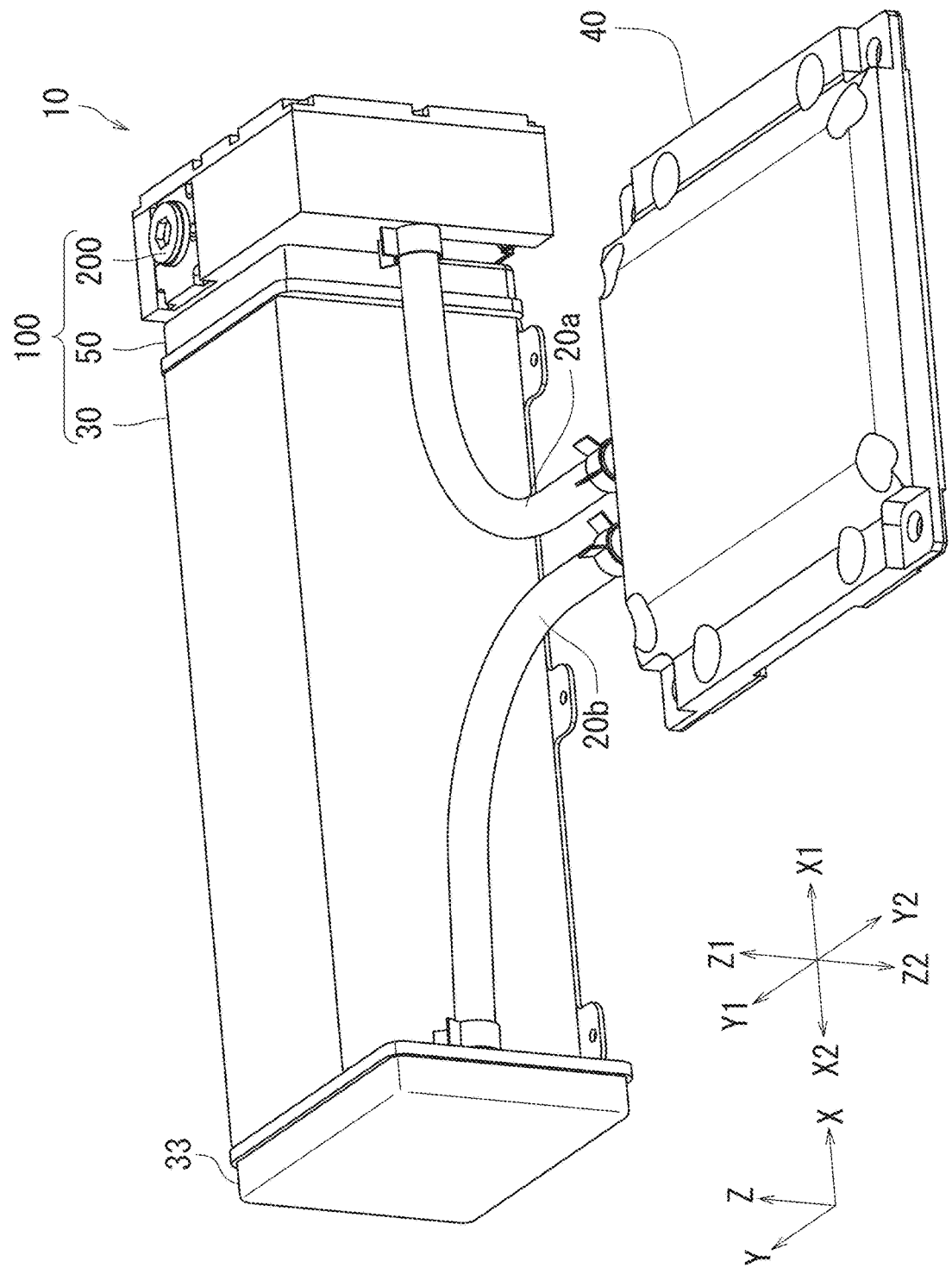
FIG. 1 is a schematic perspective view of a cooling device according to an example embodiment of the present disclosure.

Hereinafter, example embodiments of the present invention will be described with reference to the accompanying drawings. In the drawings, the same or corresponding components are denoted by the same reference signs and description thereof will not be repeated. In the following description, a first direction X, a second direction Y, and a third direction Z that are orthogonal to each other are described as appropriate for ease of understanding. In addition, a first side in the first direction X is described as a first side X1 in the first direction X, and a second side in the first direction X is described as a second side X2 in the first direction X. A first side in the second direction Y is described as a first side Y1 in the second direction Y, and a second side in the second direction Y is described as a second side Y2 in the second direction Y. A first side in the third direction Z is described as a first side Z1 in the third direction Z, and a second side in the third direction Z is described as a second side Z2 in the third direction Z. However, the direction is defined merely for convenience of description, and the direction at the time of use of the cooling device according to the present invention is not limited unless it is particularly necessary to define the horizontal direction and the vertical direction. In addition, an "orthogonal direction" in the present invention includes a substantially orthogonal direction.

Figure 2:
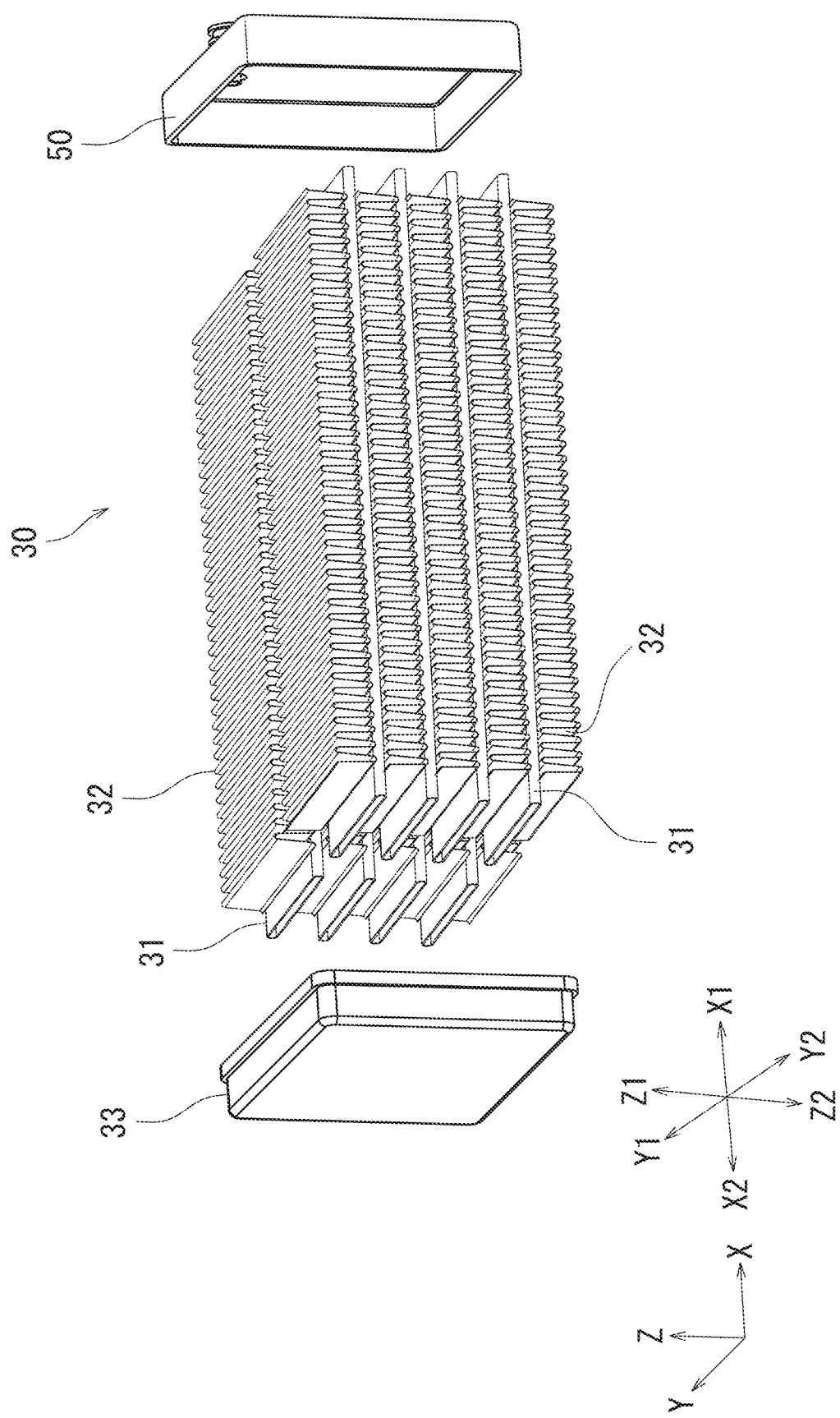
FIG. 2 is a schematic perspective view of the inside of a radiator according to an example embodiment of the present disclosure.
Figure 3:
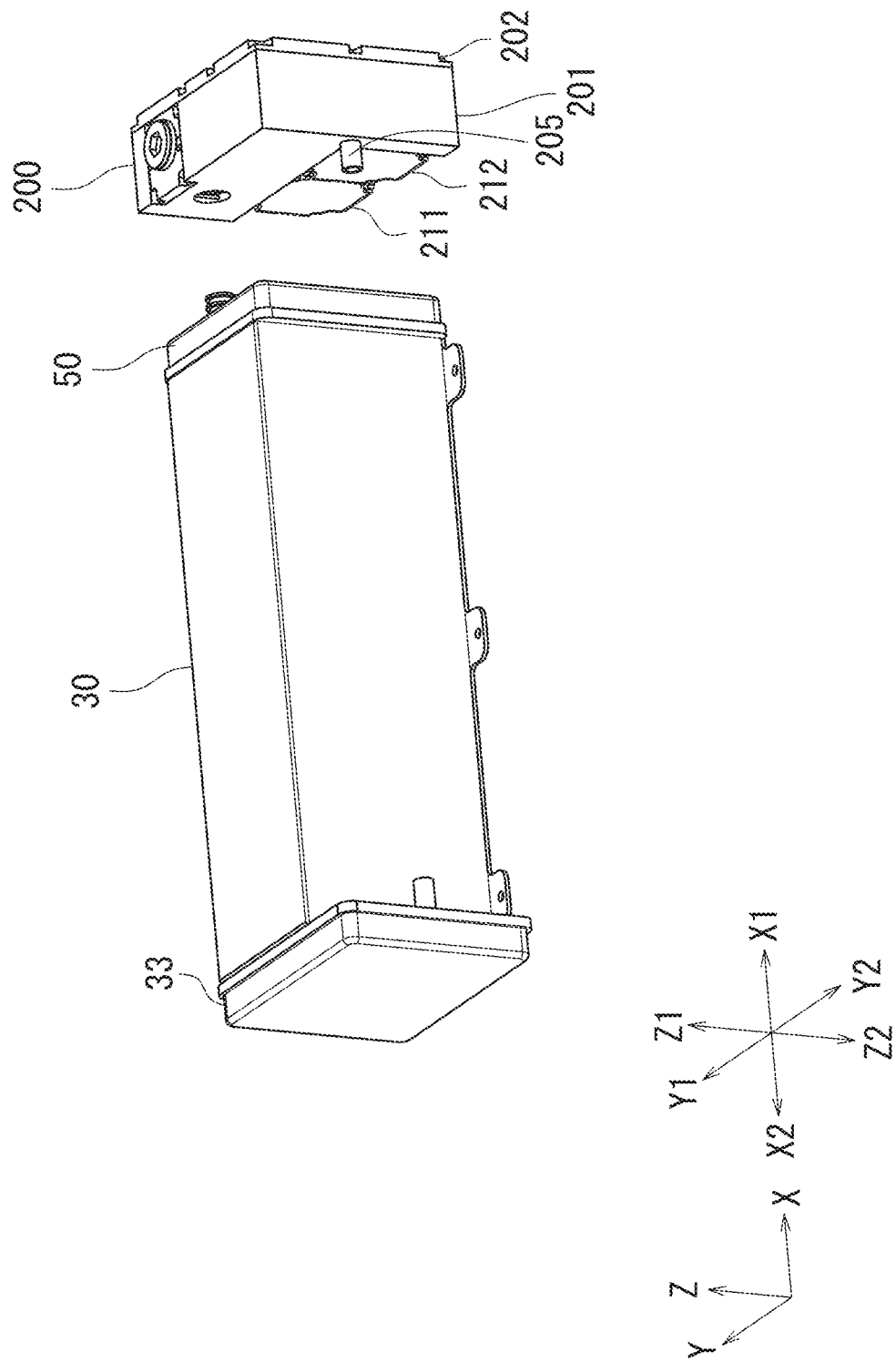
FIG. 3 is a schematic perspective view of the heat dissipation device of an example embodiment of the present disclosure.

First, a cooling device 10 having a heat dissipation device 100 according to an example embodiment will be described with reference to FIGS. 1 to 3. FIG. 1 is a schematic perspective view of a cooling device 10. FIG. 2 is a schematic perspective view of the inside of a radiator 30. FIG. 3 is a schematic perspective view of the heat dissipation device 100. FIG. 3 illustrates the heat dissipation device 100 in a state where a pump assembly 200 is separated. The cooling device 10 is used for cooling target equipment. In the cooling device 10, liquid as a refrigerant circulates.

As illustrated in FIG. 1, the cooling device 10 includes a heat dissipation device 100, a first pipe 20a, a second pipe 20b, and a cooling assembly 40. The heat dissipation device 100 includes a radiator 30, a first tank 50, and a pump assembly 200.

The radiator 30 cools the liquid. As illustrated in FIG. 2, the radiator 30 includes a plurality of refrigerant pipes 31, a plurality of fins 32, and a third tank 33 inside the radiator 30. The refrigerant pipe 31 extends along a first direction X. For example, the first direction X is a direction parallel to the X axis in the drawing. The liquid passes through the refrigerant pipe 31. For example, the liquid flows toward one side X1 in the first direction inside the refrigerant pipe 31.

The plurality of fins 32 are disposed around the refrigerant pipe 31. A part of each of the fins 32 is in contact with the refrigerant pipe 31. More specifically, the fin 32 and the refrigerant pipe 31 are joined by welding or the like. The fins 32 lower the temperature of the liquid by absorbing the heat of the refrigerant pipes 31 and the liquid and dissipating the heat to the outside air. That is, the liquid is cooled in the radiator 30.

The third tank 33 is located on the other side X2 in the first direction of the radiator 30. The third tank 33 is connected to the plurality of refrigerant pipes 31. The liquid used as a refrigerant is distributed from the third tank 33 to the plurality of refrigerant pipes 31.

The first tank 50 is connected to the plurality of refrigerant pipes 31 of the radiator 30. The liquid having passed through the refrigerant pipe 31 passes through the first tank 50. As illustrated in FIG. 3, the first tank 50 is connected to the pump assembly 200. The pump assembly 200 is located on one side X1 in the first direction of the radiator 30. The liquid having passed through the first tank 50 flows into the pump assembly 200.

The pump assembly 200 circulates the liquid flowing in from the first tank 50. The pump assembly 200 feeds liquid to the outside of the pump assembly 200 and circulates the liquid in the cooling device 10.

The pump assembly 200 includes a first pump 211, a second pump 212, and a flow path portion 203. The first pump 211 feeds the liquid and circulates the liquid in the cooling device 10. The second pump 212 feeds the liquid and circulates the liquid in the cooling device 10. The flow path portion 203 guides the liquid fed out from the first pump 211 and the second pump 212 to the outside of the pump assembly 200. That is, the liquid fed out from the first pump 211 and the second pump 212 flows through the flow path portion 203. Details of the first pump 211, the second pump 212, and the flow path portion 203 will be described later.

As described above with reference to FIGS. 1 to 3, in the pump assembly 200, the first pump 211 and the second pump 212 are arranged adjacent to each other. The first pump 211 is located on one side X1 in the first direction of the radiator 30. The second pump 212 is located on one side X1 in the first direction of the radiator 30. The first pump 211 is located on one side Y1 in the second direction of the pump assembly 200. The second pump 212 is located on the other side Y2 in the second direction of the pump assembly 200. That is, the first pump 211 and the second pump 212 are located on the same side in the first direction X with respect to the radiator 30. Therefore, as compared with a case where the first pump 211 and the second pump 212 are located on both end sides of the radiator 30, the length of the configuration other than the radiator 30 in the first direction X can be shortened in the heat dissipation device 100. Therefore, since the length of the radiator 30 in the first direction X with respect to the entire length of the heat dissipation device 100 in the first direction X can be increased, the heat dissipation performance of the heat dissipation device 100 can be improved.

Referring to FIG. 1, the first pipe 20a connects the pump assembly 200 and the cooling assembly 40. The liquid fed out from the pump assembly 200 flows through the first pipe 20a. The liquid flowing through the first pipe 20a reaches the cooling assembly 40 and passes through the flow path inside the cooling assembly 40.

Typically, the cooling assembly 40 is disposed near a heat source. For example, the cooling assembly 40 is disposed facing the heat source. Alternatively, the cooling assembly 40 may be disposed in contact with the heat source. The liquid passing through the cooling assembly 40 absorbs the heat of the heat source and lowers the temperature of the heat source. On the other hand, the temperature of the liquid that has absorbed the heat of the heat source rises. That is, the liquid is heated in the cooling assembly 40. The liquid having passed through the cooling assembly 40 reaches the second pipe 20b.

The second pipe 20b connects the cooling assembly 40 and the radiator 30. For example, the second pipe 20b is connected to the third tank 33 of the radiator 30. The liquid that has reached the second pipe 20b flows through the second pipe 20b. The liquid flowing through the second pipe 20b reaches the third tank 33.

In the cooling device 10, the circulating liquid may be water. Alternatively, the liquid circulating may be a mixed liquid of water and propylene glycol.

Figure 4:
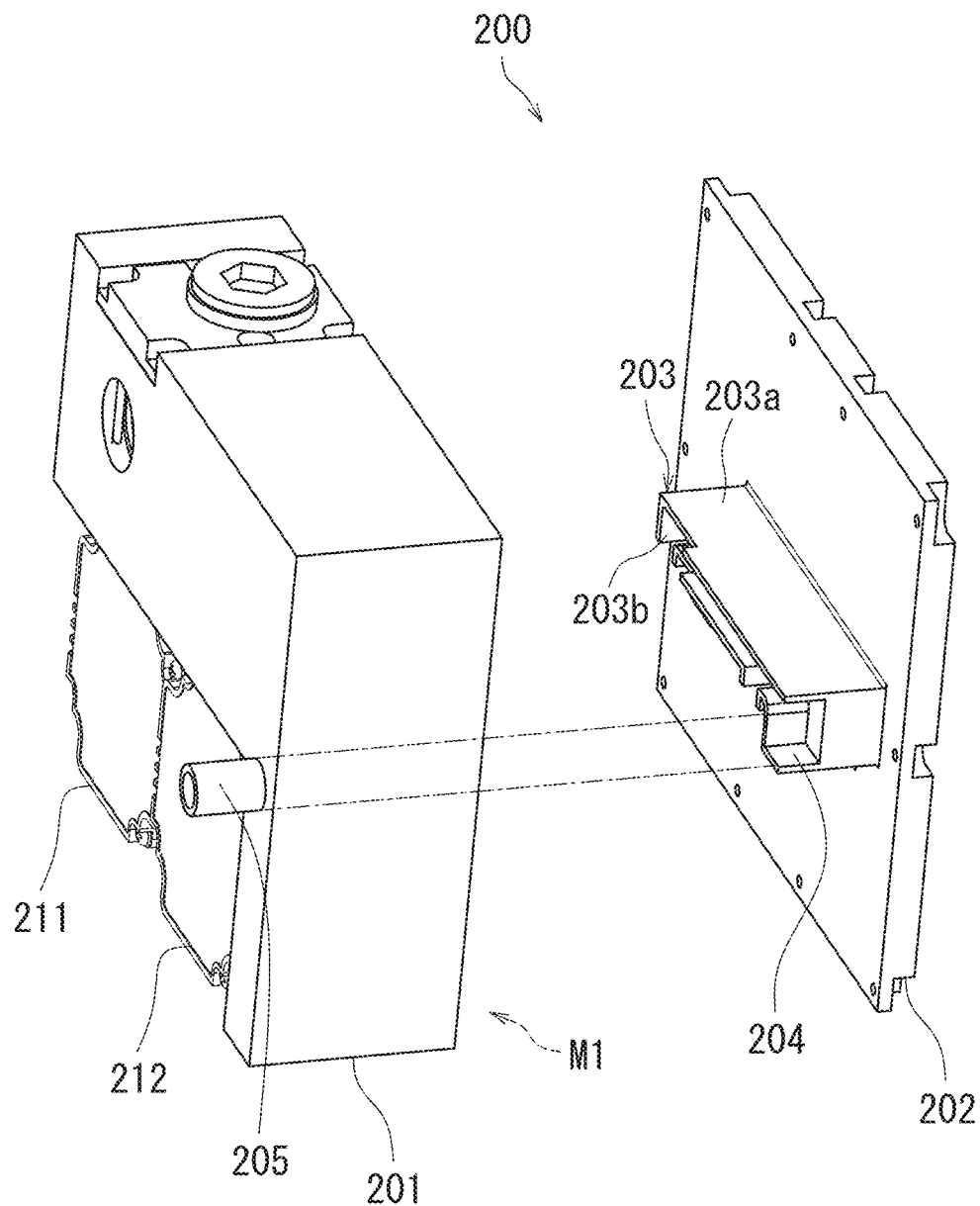
FIG. 4 is a schematic perspective view of the pump assembly of an example embodiment of the present disclosure.

Next, the pump assembly 200 of the heat dissipation device 100 will be described in detail with reference to FIGS. 3 and 4. FIG. 4 is a schematic perspective view of the pump assembly 200. FIG. 4 illustrates the pump assembly 200 in a state where a casing body 201 and a cover portion 202 are separated.

The pump assembly 200 includes a casing body 201 and a cover portion 202. An opening M1 is disposed on the surface of the casing body 201 on one side X1 in the first direction. The cover portion 202 covers the opening M1. The first pump 211 and the second pump 212 are disposed in the casing body 201. The flow path portion 203 is disposed on the other side X2 in the first direction of the cover portion 202.

The structure of the cover portion 202 is simpler than the structure of the casing body 201. When the flow path portion 203 is disposed in the cover portion 202, the structure of the casing body 201 can be simplified as compared with the case where the flow path portion 203 is disposed in the casing body 201. Therefore, the casing body 201 is easily formed. As a result, the casing body 201 can be manufactured at low cost.

Specifically, the flow path portion 203 protrudes from the surface of the cover portion 202 on the other side X2 in the first direction toward the other side X2 in the first direction. For example, the flow path portion 203 extends in the second direction Y. For example, the cover portion 202 and the flow path portion 203 are formed of a single member.

More specifically, the flow path portion 203 has a flow path wall 203a and an outflow path 203b. The flow path wall 203a protrudes from the surface of the cover portion 202 on the other side X2 in the first direction toward the other side X2 in the first direction. The outflow path 203b is a region surrounded by the flow path wall 203a. The liquid fed out from the first pump 211 and the second pump 212 flows through the outflow path 203b.

The pump assembly 200 includes a pipe connection portion 205 and an outflow portion 204. The first pipe 20a is connected to the pipe connection portion 205. The outflow portion 204 guides the liquid flowing through the flow path portion 203 to the pipe connection portion 205. The pipe connection portion 205 protrudes from the other side X2 in the first direction of the casing body 201. The pipe connection portion 205 is located at a position shifted in the second direction Y with respect to the radiator 30. Therefore, the pipe connection portion 205 can protrude in the direction toward the inside of the radiator 30. Therefore, in the length of the heat dissipation device 100 in the first direction X, the ratio of the pump assembly 200 to the heat dissipation device 100 can be suppressed. As a result, the length of the radiator 30 in the first direction X can be further increased.

Specifically, the outflow portion 204 is located at the end on the other side Y2 in the second direction of the flow path portion 203. The outflow portion 204 extends toward the other side X2 in the first direction and is connected to the pipe connection portion 205. That is, the pipe connection portion 205 is located at a position shifted in the second direction Y with respect to the radiator 30. The pipe connection portion 205 protrudes from the other side X2 in the first direction of the casing body 201 toward the other side X2 in the first direction.

The liquid fed out from the first pump 211 and the second pump 212 and flowing through the flow path portion 203 passes through the outflow portion 204 and reaches the pipe connection portion 205. The liquid that has reached the pipe connection portion 205 flows into the first pipe 20a and flows through the first pipe 20a.

Figure 5:
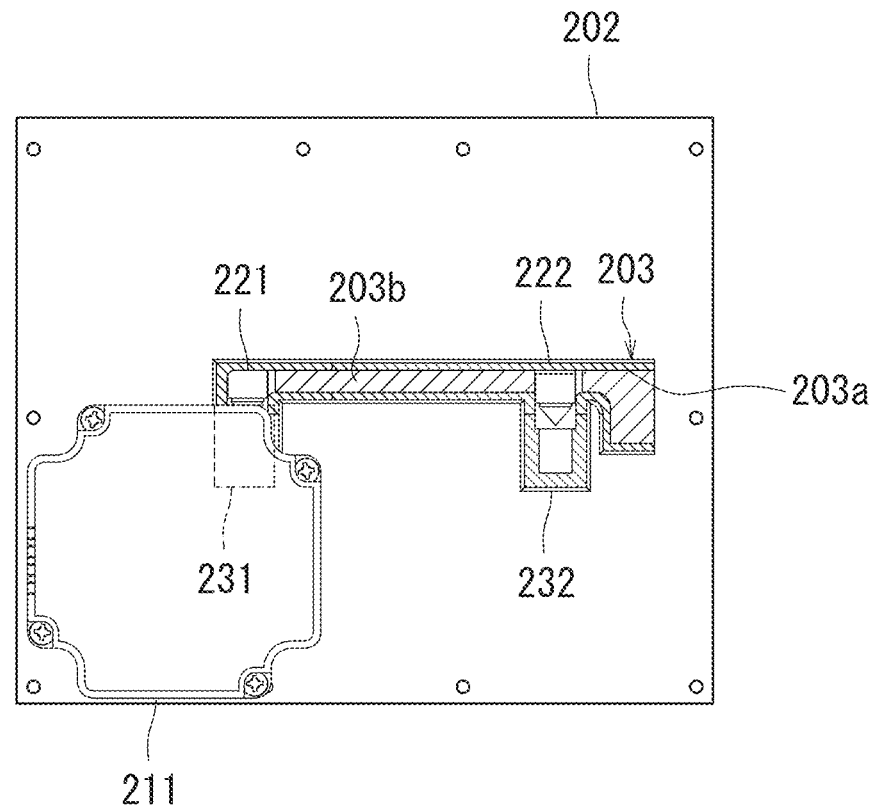
FIG. 5 is a schematic view illustrating a surface on the other side in a first direction of a cover portion of an example embodiment of the present disclosure.
Figure 5:
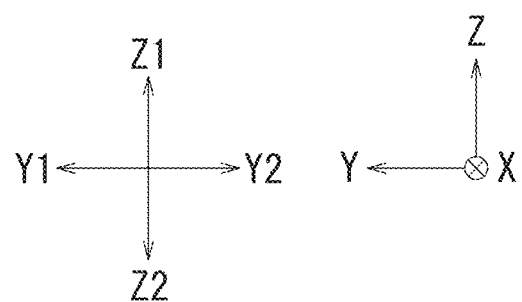
Figure 6:
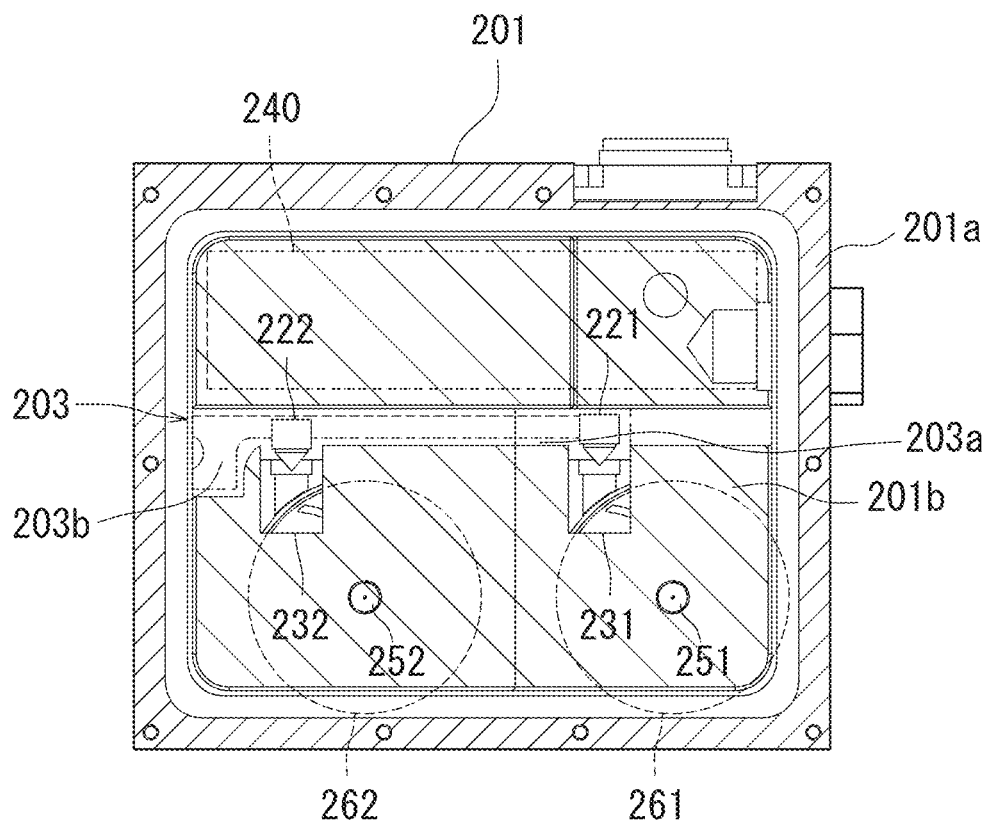
FIG. 6 is a schematic view illustrating a surface on one side in the first direction of a casing body of an example embodiment of the present disclosure.
Figure 6:
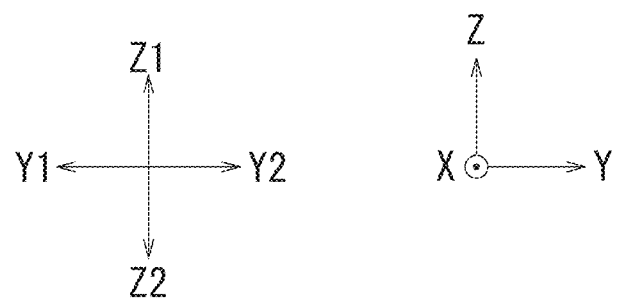

Next, the flow path portion 203 will be described in detail with reference to FIGS. 5 and 6. FIG. 5 is a schematic view illustrating a surface of the cover portion 202 on the other side X2 in the first direction. FIG. 6 is a schematic view illustrating a surface of the casing body 201 on one side X1 in the first direction. For easy understanding, the casing body 201 and the second pump 212 are omitted in FIG. 5. FIG. 6 illustrates the casing body 201 in a state where the cover portion 202 is removed.

The casing body 201 includes a first pump chamber 261, a second pump chamber 262, a first outflow port 231, a second outflow port 232, a second tank 240, a first inflow port 251, and a second inflow port 252. The first pump 211 is disposed in the first pump chamber 261. The second pump 212 is disposed in the second pump chamber 262. The first outflow port 231 connects the first pump chamber 261 and the flow path portion 203. The liquid fed out from the first pump 211 passes through the first outflow port 231 from the first pump chamber 261, and flows out to the flow path portion 203. The second outflow port 232 connects the second pump chamber 262 and the flow path portion 203. The liquid fed out from the second pump 212 passes through the second outflow port 232 from the second pump chamber 262 and flows out to the flow path portion 203.

The flow path portion 203 includes a first check valve 221 and a second check valve 222. The first check valve 221 is disposed downstream of the first outflow port 231. While the first pump 211 is stopped, the first check valve 221 blocks the inflow of liquid into the first outflow port 231. Therefore, the first check valve 221 can prevent the liquid from flowing back from the flow path portion 203 to the first pump 211 in the stopped state.

The second check valve 222 is disposed downstream of the second outflow port 232. While the second pump 212 is stopped, the second check valve 222 blocks the inflow of liquid into the second outflow port 232. Therefore, the second check valve 222 can prevent the liquid from flowing back from the flow path portion 203 to the second pump 212 in the stopped state.

Specifically, the casing body 201 includes a sidewall 201a and an inner wall 201b. The sidewall 201a constitutes a side surface of the casing body 201. The inner wall 201b is connected to the sidewall 201a and defines the first pump chamber 261, the second pump chamber 262, and the second tank 240. The second tank 240 is a space surrounded by the sidewall 201a, the inner wall 201b, and the cover portion 202. That is, the sidewall 201a, the inner wall 201b, and the cover portion 202 constitute a wall surface of the second tank 240.

For example, the casing body 201 is formed of the same member as the cover portion 202. The casing body 201 is made of resin, for example. The casing body 201 has, for example, a box shape.

The first pump chamber 261 is located on the other side X2 in the first direction of the casing body 201 with respect to the inner wall 201b. The first pump chamber 261 is a space recessed in a substantially cylindrical shape from the surface of the inner wall 201b on the other side X2 in the first direction toward the one side X1 in the first direction. Further, the first pump chamber 261 is located on one side Y1 in the second direction of the casing body 201. The second pump chamber 262 is located on the other side X2 in the first direction of the casing body 201 with respect to the inner wall 201b. The second pump chamber 262 is a space recessed in a substantially cylindrical shape from the surface of the inner wall 201b on the other side X2 in the first direction toward the one side X1 in the first direction. The second pump chamber 262 is located on the other side Y2 in the second direction of the casing body 201 with respect to the first pump chamber 261.

The flow path portion 203 is located on one side Z1 in the third direction with respect to the first pump chamber 261 and the second pump chamber 262.

The first outflow port 231 connects the first pump chamber 261 and the outflow path 203b. Specifically, the first outflow port 231 penetrates the inner wall 201b. The first outflow port 231 is located on one side Z1 in the third direction of the first pump chamber 261. The second outflow port 232 connects the second pump chamber 262 and the outflow path 203b. Specifically, the second outflow port 232 penetrates the inner wall 201b. The second outflow port 232 is located on one side Z1 in the third direction of the second pump chamber 262.

The first check valve 221 is disposed on one side Z1 in the third direction of the first outflow port 231 in the outflow path 203b. The shape of the first check valve 221 is a shape in which a cylindrical member and a conical member are coupled. Specifically, one bottom surface of the cylindrical member is connected to the bottom surface of the conical member. The conical member is located on the other side Z2 in the third direction.

The first check valve 221 is movable along the third direction Z. The position of the first check valve 221 in the third direction Z changes according to the drive or stop of the first pump 211. In a state where the first pump 211 is driven, the liquid is fed out from the first pump chamber 261 through the first outflow port 231. Due to the pressure of the fed liquid, the first check valve 221 moves to one side Z1 in the third direction. A flow path through which the liquid flows is formed between the first check valve 221 moved to the one side Z1 in the third direction and the first outflow port 231. Since the other side Z2 in the third direction of the first check valve 221 has a conical shape, the liquid fed out from the first pump chamber 261 can smoothly flow without resistance of the outflow path 203b.

On the other hand, in a state where the first pump 211 is stopped, the liquid is not fed out from the first pump chamber 261 through the first outflow port 231. That is, the pressure of the fed liquid is not applied to the first check valve 221. The first check valve 221 moves to the other side Z2 in the third direction by its own weight, for example. The first check valve 221 moved to the other side Z2 in the third direction closes the first outflow port 231. More specifically, the diameter of the cylindrical member of the first check valve 221 is the same as the flow path of the first outflow port 231 or larger than the flow path of the first outflow port 231. Therefore, the cylindrical member of the first check valve 221 closes the first outflow port 231.

The second check valve 222 is disposed on the one side Z1 in the third direction of the second outflow port 232 in the flow path portion 203. The shape of the second check valve 222 is the same as that of the first check valve 221.

The second check valve 222 is movable along the third direction Z. The position of the second check valve 222 in the third direction Z changes according to the drive or stop of the second pump 212. The relationship between the movement of the second check valve 222 and the drive or stop of the second pump 212 is the same as the relationship between the movement of the first check valve 221 and the drive or stop of the first pump 211.

The first check valve 221 and the second check valve 222 may be configured to be attached to the other side Z2 in the third direction by an attaching member such as a spring. For example, the attaching member is disposed inside the first check valve 221 and the second check valve 222.

Figure 7:
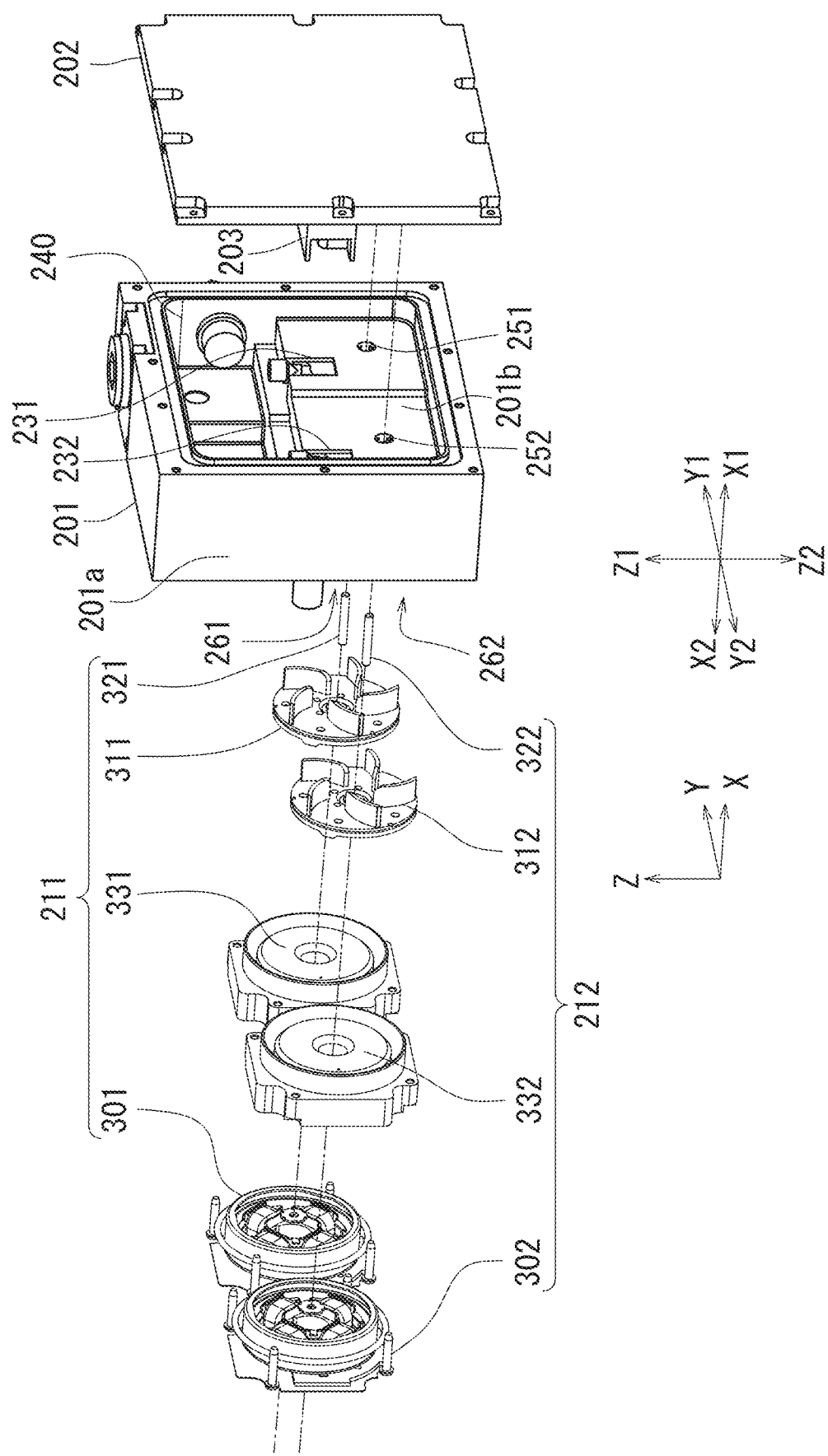
FIG. 7 is a schematic view illustrating a first pump and a second pump of an example embodiment of the present disclosure.

Next, the first pump 211 and the second pump 212 will be described in detail with reference to FIG. 7. FIG. 7 is a schematic view illustrating the first pump 211 and the second pump 212. FIG. 7 illustrates the first pump 211 and the second pump 212 in a disassembled state.

The first pump 211 includes a first impeller 311, a first motor 301, and a first rotation shaft 321. The first motor 301 rotates about the first rotation shaft 321. The first rotation shaft 321 extends in the first direction X to couple the first motor 301 and the first impeller 311. The first motor 301 rotates the first impeller 311. Therefore, when the first rotation shaft 321 is shorter than the diameter of the first impeller 311, the length of the first pump 211 in the first direction X can be suppressed.

The second pump 212 includes a second impeller 312, a second motor 302, and a second rotation shaft 322. The second motor 302 rotates about the second rotation shaft 322. The second rotation shaft 322 extends in the first direction X to couple the second motor 302 and the second impeller 312. The second motor 302 rotates the second impeller 312. Therefore, when the second rotation shaft 322 is shorter than the diameter of the second impeller 312, the length of the second pump 212 in the first direction X can be suppressed. Therefore, the length of the pump assembly 200 in the first direction X can be suppressed.

Specifically, the first motor 301 includes a first stator (not illustrated), a first rotor (not illustrated), and a first motor casing 331. The first impeller 311 is attached to on one side X1 in the first direction of the first rotor. The first motor casing 331 covers the other side X2 in the first direction of the first pump chamber 261. Therefore, the first stator and the first rotor are isolated from each other by the first motor casing 331. That is, the first stator is isolated from the liquid.

The first rotation shaft 321 is rotatably supported by the first motor casing 331 and the inner wall 201b of the casing body 201.

The first impeller 311 is disposed in the first pump chamber 261. The first impeller 311 is attached to on one side X1 in the first direction of the first rotation shaft 321. The first rotor rotates by the magnetic action of the first stator. As a result, the first motor 301 rotates about the first rotation shaft 321. The first impeller 311 rotates according to the rotation of the first motor 301. That is, the first motor 301 rotates the first impeller 311 about the first rotation shaft 321.

By the rotation of the first impeller 311, the liquid in the first pump chamber 261 is pushed out and flows out from the first outflow port 231 to the flow path portion 203. Therefore, when the first motor 301 rotates the first impeller 311, the liquid can circulate through the cooling device 10.

The second motor 302 includes a second stator (not illustrated), a second rotor (not illustrated), and a second motor casing 332. The second impeller 312 is attached to on one side X1 in the first direction of the second rotor. The second motor casing 332 covers the other side X2 in the first direction of the second pump chamber 262. Therefore, the second stator and the second rotor are isolated from each other by the second motor casing 332. That is, the second stator is isolated from the liquid. The second rotation shaft 322 is rotatably supported by the second motor casing 332 and the inner wall 201b of the casing body 201.

The second impeller 312 is disposed in the second pump chamber 262. The second impeller 312 is attached to on one side X1 in the first direction of the second rotation shaft 322. The second rotor rotates by the magnetic action of the second stator. As a result, the second motor 302 rotates about the second rotation shaft 322. The second impeller 312 rotates according to the rotation of the second motor 302. That is, the second motor 302 rotates the second impeller 312 about the second rotation shaft 322.

By the rotation of the second impeller 312, the liquid in the second pump chamber 262 is pushed out and flows out from the second outflow port 232 to the flow path portion 203. Therefore, when the second motor 302 rotates the second impeller 312, the liquid can circulate through the cooling device 10.

The rotation of the first motor 301 and the rotation of the second motor 302 may be performed simultaneously, or any one of them may be performed.

Next, the second tank 240 will be described with reference to FIGS. 6 and 7.

The second tank 240 is connected to the first tank 50. The liquid flows from the first tank 50 into the second tank 240. The first inflow port 251 connects the second tank 240 and the first pump chamber 261. The liquid flows from the second tank 240 into the first pump chamber 261 through the first inflow port 251. The second inflow port 252 connects the second tank 240 and the second pump chamber 262. The liquid flows from the second tank 240 into the second pump chamber 262 through the second inflow port 252. The second tank 240 is located at a position away from the first inflow port 251 and the second inflow port 252 on one side Z1 in the third direction. That is, the first inflow port 251 and the second inflow port 252 are located vertically below the second tank 240.

Therefore, since the air mixed with the liquid from the first tank 50 is accumulated on the vertically upper side of the second tank 240, the air does not pass through the first inflow port 251 and the second inflow port 252. Therefore, it is possible to prevent air from being mixed into the first pump chamber 261 and the second pump chamber 262.

The first inflow port 251 is located at the center of the first pump chamber 261. The first rotation shaft 321 is located at the center of the first pump chamber 261.

The second inflow port 252 is located at the center of the second pump chamber 262. The second rotation shaft 322 is located at the center of the second pump chamber 262.

Figure 8:
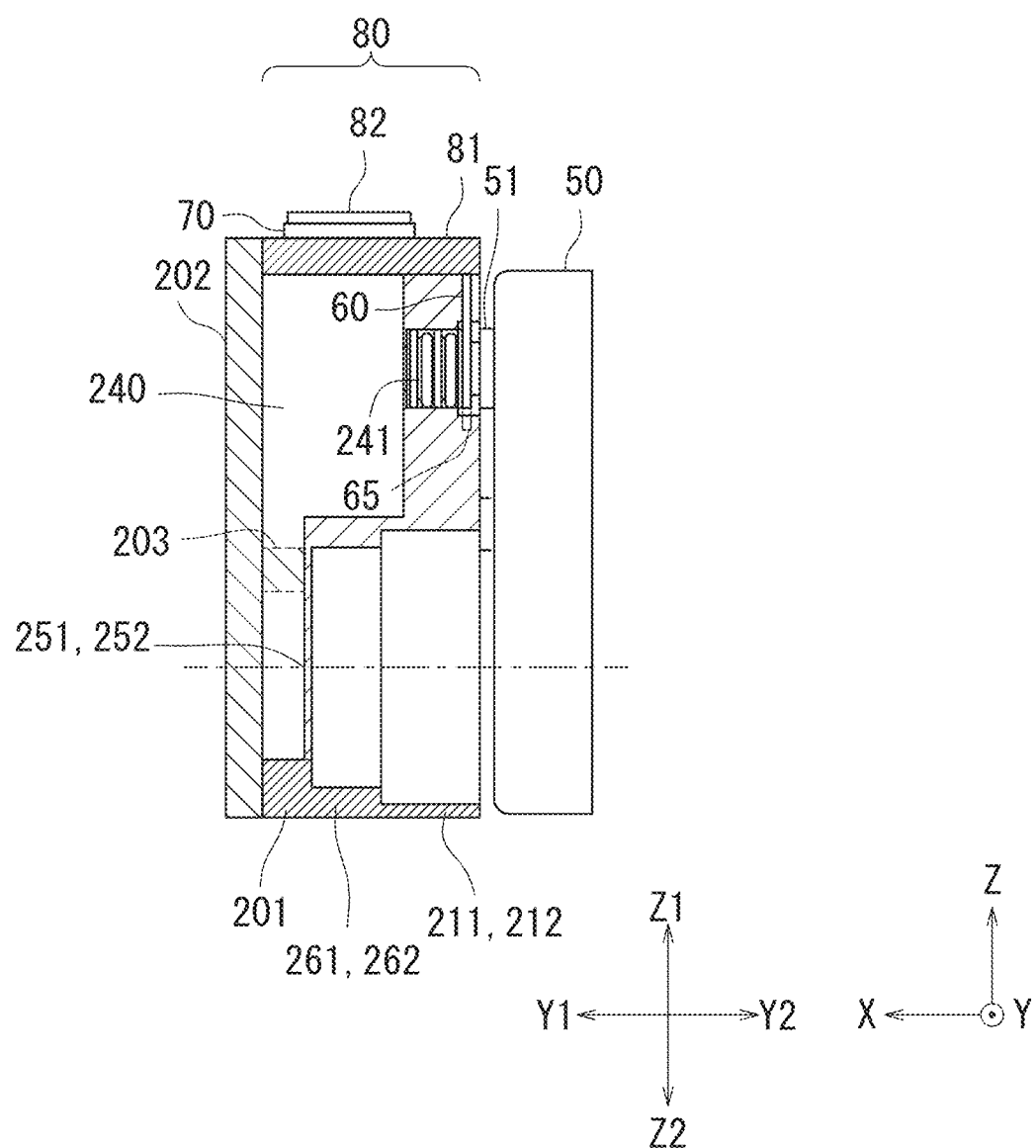
FIG. 8 is a cross-sectional view in a plane perpendicular to a second direction and passing through a tank connection portion and a through hole in the heat dissipation device of an example embodiment of the present disclosure.
Figure 9:
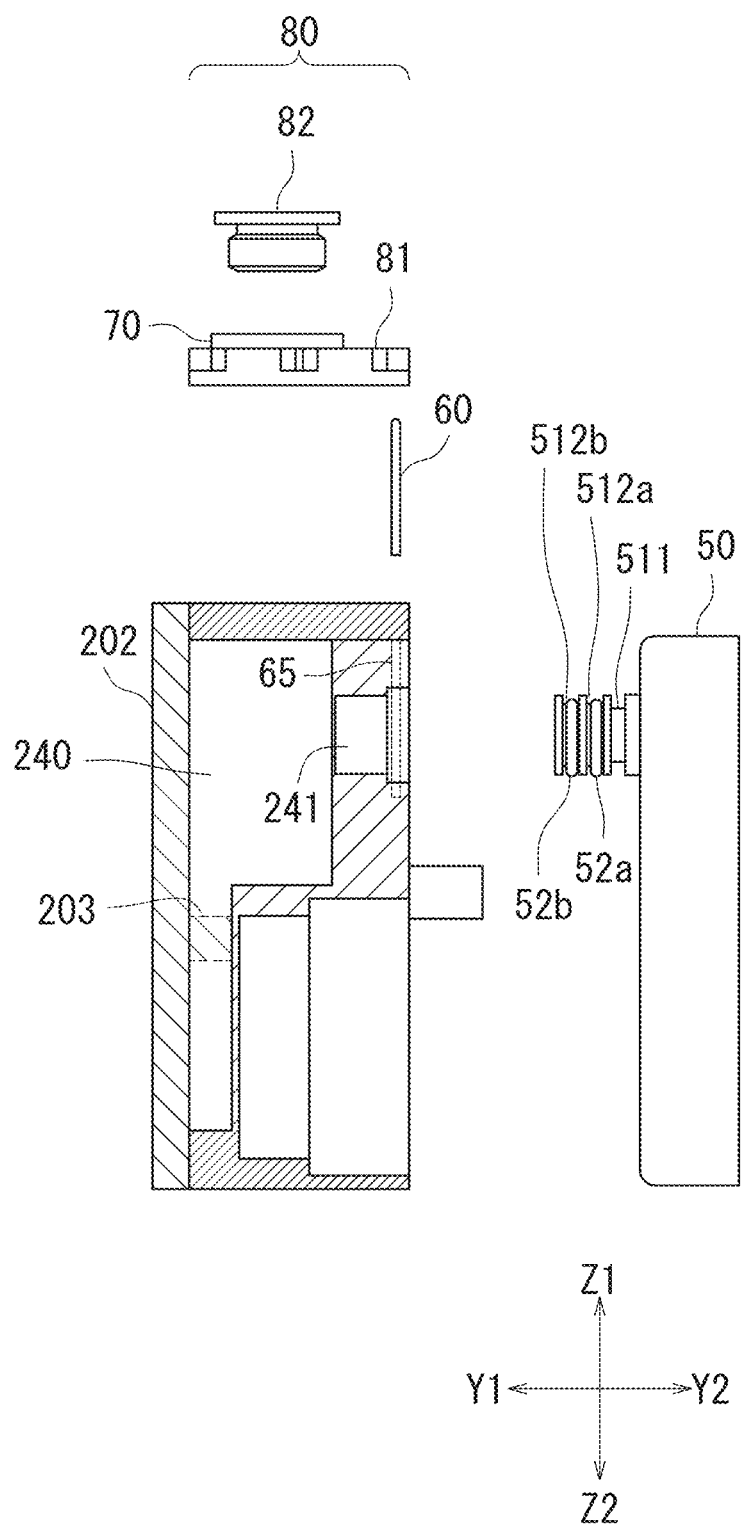
FIG. 9 is a cross-sectional view in a plane perpendicular to the second direction and passing through the tank connection portion and the through hole in the heat dissipation device of an example embodiment of the present disclosure.
Figure 10:
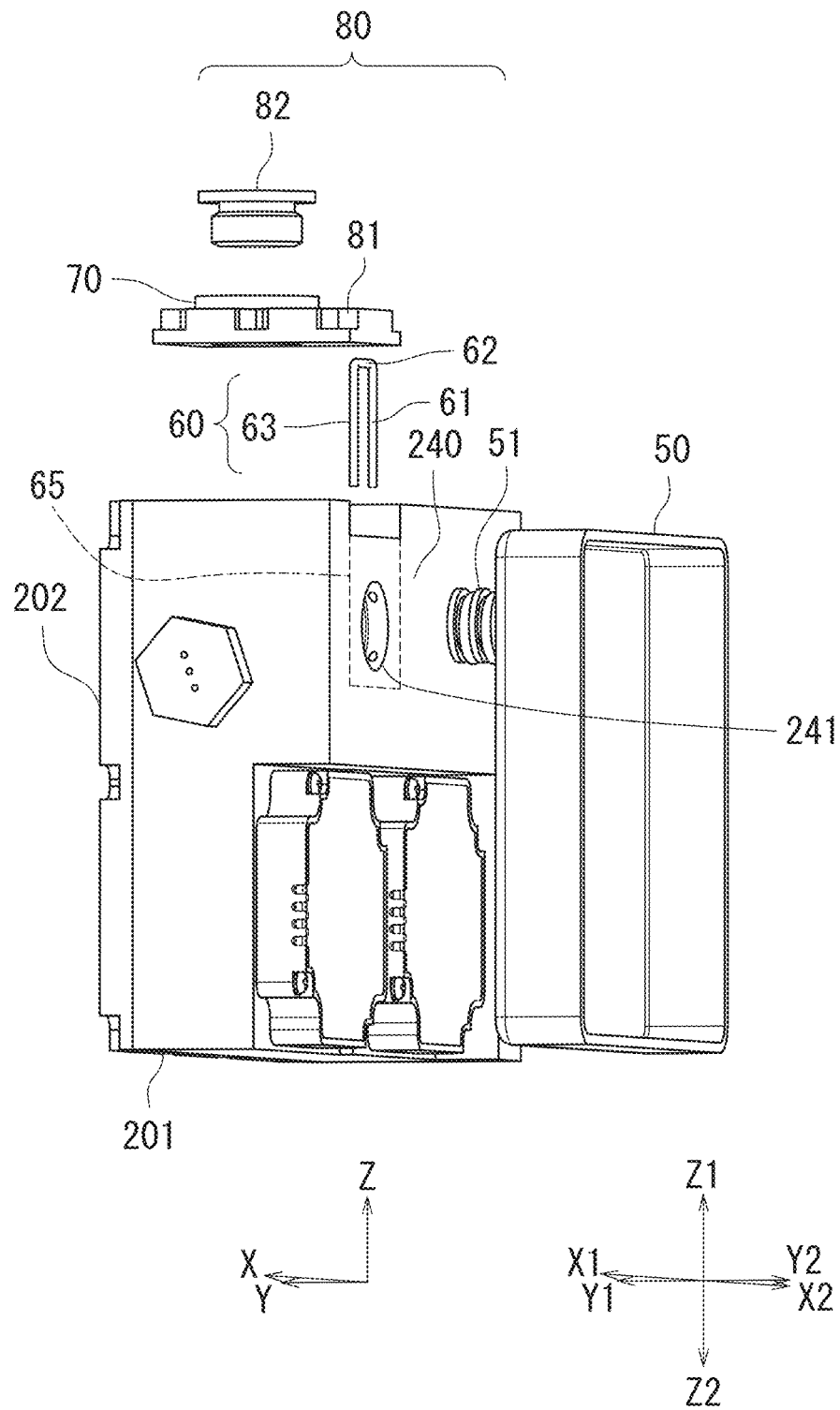
FIG. 10 is a perspective view illustrating a first tank and a pump assembly of an example embodiment of the present disclosure.

Next, connection between the first tank 50 and the second tank 240 will be described with reference to FIGS. 8 to 10. FIGS. 8 and 9 are cross-sectional views in a plane perpendicular to the second direction Y and passing through a tank connection portion 51 and a through hole 241. FIG. 10 is a perspective view illustrating the first tank 50 and the pump assembly 200. FIG. 8 illustrates a state in which each part of the pump assembly 200 and the first tank 50 are connected. FIG. 9 illustrates a state in which each part of the pump assembly 200 and the first tank 50 are separated. FIG. 10 is a perspective view in the state illustrated in FIG. 9.

The first tank 50 has the tank connection portion 51. The tank connection portion 51 is connected to the second tank 240. The second tank 240 has the through hole 241. The through hole 241 penetrates the wall surface of the second tank 240 on the other side X2 in the first direction. Specifically, the through hole 241 penetrates the inner wall 201b. The tank connection portion 51 protrudes to one side X1 in the first direction of the first tank 50. At least a part of the tank connection portion 51 is located in the through hole 241. Therefore, the first tank 50 and the second tank 240 can be directly coupled, and the number of parts can be reduced.

The tank connection portion 51 has a cylindrical shape. The through hole 241 is a circular hole. The diameter of the through hole 241 is larger than the diameter of the tank connection portion 51. The through hole 241 extends in the first direction X.

The pump assembly 200 includes a fixing assembly 60. The fixing assembly 60 fixes the first tank 50 to the second tank 240. The casing body 201 has a hole 65. The fixing assembly 60 is disposed in the hole 65. The hole 65 extends in a direction intersecting the through hole 241. The tank connection portion 51 has a first groove portion 511. The first groove portion 511 is recessed on the peripheral surface of the tank connection portion 51. A part of the fixing assembly 60 is located in the first groove portion 511 inside the through hole 241. Accordingly, the fixing assembly 60 restricts the movement of the tank connection portion 51 in the through hole 241. Therefore, the first tank 50 and the second tank 240 can be fixed with a simple configuration.

Specifically, the fixing assembly 60 includes a first fixing portion 61, a second fixing portion 62, and a third fixing portion 63. The first fixing portion 61 is coupled to the second fixing portion 62. The third fixing portion 63 is coupled to the second fixing portion 62. That is, the second fixing portion 62 couples the first fixing portion 61 and the third fixing portion 63. The first fixing portion 61 and the second fixing portion 62 are orthogonal to each other. For example, the first fixing portion 61 extends in the third direction Z. The second fixing portion 62 extends in the second direction Y. The third fixing portion 63 and the second fixing portion 62 are orthogonal to each other. For example, the third fixing portion 63 extends in the third direction Z.

The hole 65 extends from the surface of the casing body 201 on the one side Z1 in the third direction toward the other side Z2 in the third direction. The hole 65 intersects with the through hole 241. The first fixing portion 61 and the third fixing portion 63 are disposed in the hole 65. A part of the first fixing portion 61 is located in the first groove portion 511 inside the through hole 241. A part of the third fixing portion 63 is located in the first groove portion 511 inside the through hole 241.

The tank connection portion 51 includes second groove portions 512a and 512b and seals 52a and 52b. The second groove portions 512a and 512b are recessed in the peripheral surface of the tank connection portion 51. The second groove portions 512a and 512b are located farther from the first tank 50 than the first groove portion 511. The seals 52a and 52b are, for example, O-rings. The seal 52a is located in the second groove portion 512a. The seal 52b is located in the second groove portion 512b. The seals 52a and 52b are in contact with the inner peripheral surface of the through hole 241. The seals 52a and 52b seal the through hole 241. Therefore, the through hole 241 is sealed, and the liquid flowing out from the first tank 50 can be prevented from leaking to other than the second tank 240.

The tank connection portion 51 may be configured to include any one of the seals 52a and 52b.

The second tank 240 includes an injection port 70 and an injection port cover portion 80. The liquid is injected into the injection port 70 from the outside of the second tank 240. The injection port cover portion 80 covers the injection port 70. The injection port 70 is located on one side Z1 in the third direction of the second tank 240.

When the liquid in the second tank 240 decreases, new liquid is injected from the outside of the cooling device 10 into the second tank 240 through the injection port 70. That is, the liquid is replenished to the second tank 240. Therefore, since the injection port 70 is located on the one side Z1 in the third direction of the second tank 240, the amount of liquid replenished to the second tank 240 increases.

The injection port cover portion 80 includes a base 81 and a water plug 82. The base 81 covers the periphery of the injection port 70. The water plug 82 plugs the injection port 70. Therefore, since the injection port cover portion 80 is separated into the water plug 82 and the base 81, attachment and detachment of the water plug 82 from the injection port 70 is facilitated.

The injection port cover portion 80 covers the fixing assembly 60. Therefore, the fixing assembly 60 can be prevented from falling off from the hole 65.

For example, the injection port 70 is a rubber packing. Specifically, the rubber packing is disposed along the circular hole located on one side Z1 in the third direction of the second tank 240. For example, the inner peripheral side of the rubber packing is threaded. That is, the rubber packing functions as a screw hole. For example, the base 81 is a lid made of the same material as the casing body 201. The base 81 may be made of a material different from that of the casing body 201.

The base 81 is disposed around the injection port 70 and covers the periphery of the injection port 70 and the fixing assembly 60. Specifically, the base 81 is located on the one side Z1 in the third direction of the second fixing portion 62.

For example, the water plug 82 is a rubber plug. For example, the outer periphery of the rubber plug is threaded. That is, the rubber plug functions as a screw.

The injection port 70 and the water plug 82 may not be threaded. For example, the water plug 82 may be press-fitted into the injection port 70.

As described above with reference to FIGS. 1 to 10, the cooling device 10 includes the heat dissipation device 100, the first pipe 20a, the second pipe 20b, and the cooling assembly 40. The first pipe 20a connects the pump assembly 200 and the cooling assembly 40. The liquid flows through the first pipe 20a. The second pipe 20b connects the cooling assembly 40 and the radiator 30. The liquid flows through the second pipe 20b.

In the heat dissipation device 100 in the present example embodiment, the length of the heat dissipation device 100 in the first direction X can be shortened. Therefore, the length of the cooling device 10 in the first direction X can be shortened.

In FIGS. 1 to 10, the radiator 30 in which the first direction X is the longitudinal direction has been described as an example, but the longitudinal direction of the radiator 30 may be other than the first direction X.

The example embodiments of the present invention have been described above with reference to the drawings (FIGS. 1 to 10). However, the present invention is not limited to the above example embodiments, and can be implemented in various aspects without departing from the range of the gist of the present invention. Additionally, the plurality of components disclosed in the above example embodiments can be appropriately modified. For example, one component of all components shown in one example embodiment may be added to a component of another example embodiment, or some components of all components shown in one example embodiment may be eliminated from the one example embodiment.

The drawings schematically illustrate each component mainly to facilitate understanding of the invention, and thus each illustrated component may be different in thickness, length, number, interval, or the like from actual one for convenience of creating the drawings. The configuration of each component described in the above example embodiments is an example, and is not particularly limited. Thus, it is needless to say that various modifications can be made without substantially departing from the range of effects of the present invention.

The present invention can be used in the fields of heat dissipation devices and cooling devices.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A heat dissipation device comprising:
a radiator to cool a liquid and extending in a first direction;
a first tank connected to the radiator and through which the liquid passes; and
a pump assembly connected to the first tank to circulate the liquid flowing in from the first tank; wherein
the radiator includes a pipe through which the liquid passes;
the pipe extends along the first direction;
the pump assembly is located on one side of the radiator in the first direction;
the pump assembly includes:
a first pump to feed and circulate the liquid;
a second pump to feed and circulate the liquid; and
a flow path portion to guide the liquid fed out from the first pump and the second pump toward an outside of the pump assembly;
the heat dissipation device further includes:
a casing body in which the first pump and the second pump are located; and
a cover portion to cover an opening on one side of the casing body in the first direction;
the flow path portion is on another side of the cover portion in the first direction;
the casing body includes:
a first pump chamber in which the first pump is located;
a second pump chamber in which the second pump is located;
a second tank that is connected to the first pump chamber and the second pump chamber and through which the liquid flowing in from the first tank passes;
a first inflow port that connects the second tank and the first pump chamber and through which the liquid flows from the second tank into the first pump chamber; and
a second inflow port that connects the second tank and the second pump chamber and through which the liquid flows from the second tank into the second pump chamber;
the flow path portion contacts a side surface of the casing body which is opposed to a second direction, the second direction is orthogonal to the first direction; and
the flow path portion is arranged above the first inflow port and the second inflow port in a third direction orthogonal to the first direction and the second direction.

2. The heat dissipation device according to claim 1, wherein
the pump assembly includes:
a pipe connection portion to which the pipe through which the liquid flows is connected; and
an outflow portion to guide the liquid flowing through the flow path portion to the pipe connection portion; wherein
the pipe connection portion protrudes from the other side of the casing body in the first direction; and
the pipe connection portion is located at a position shifted from the radiator in the second direction.

3. The heat dissipation device according to claim 1, wherein
the casing body includes:
a first outflow port that connects the first pump chamber and the flow path portion and through which the liquid flows out from the first pump chamber to the flow path portion; and
a second outflow port that connects the second pump chamber and the flow path portion and through which the liquid flows out from the second pump chamber to the flow path portion; wherein
the flow path portion includes:
a first check valve downstream of the first outflow port; and
a second check valve downstream of the second outflow port;
the first check valve blocks inflow of the liquid to the first outflow port in a state when the first pump is stopped; and
the second check valve blocks inflow of the liquid to the second outflow port in a state where the second pump is stopped.

4. The heat dissipation device according to claim 3, wherein
the first pump includes:
a first impeller;
a first motor to rotate the first impeller; and a first rotation shaft extending in the first direction and coupling the first motor and the first impeller;

the first motor is rotatable about the first rotation shaft;

the second pump includes:
- a second impeller;
- a second motor to rotate the second impeller; and
- a second rotation shaft extending in the first direction and coupling the second motor and the second impeller; and the second motor is rotatable about the second rotation shaft.

5. The heat dissipation device according to claim 3, wherein the second tank is spaced away from the first inflow port and the second inflow port on one side in the third direction; and the one side in the third direction corresponds to a vertically upward direction.

6. The heat dissipation device according to claim 5, wherein the first tank includes a tank connection portion connected to the second tank;

the second tank includes a through hole penetrating a wall of the second tank;

the tank connection portion protrudes to one side of the first tank in the first direction;

the through hole is on a surface of the second tank on another side in the first direction; and at least a portion of the tank connection portion is located in the through hole.

7. The heat dissipation device according to claim 6, wherein the pump assembly includes:
- a fixing assembly to fix the first tank to the second tank;

the casing body includes:
- a hole in which the fixing assembly is located;
- the hole extends in a direction intersecting the through hole;
- the tank connection portion includes a first groove portion recessed on a peripheral surface of the tank connection portion; and a portion of the fixing assembly is located in the first groove portion inside the through hole.

8. The heat dissipation device according to claim 7, wherein the tank connection portion includes:
- a seal to seal the through hole; and
- a second groove portion recessed on the peripheral surface of the tank connection portion; wherein the second groove portion is farther from the first tank than the first groove portion;

the seal is located in the second groove portion; and the seal is in contact with an inner peripheral surface of the through hole.

9. The heat dissipation device according to claim 7, wherein the second tank includes:
- an injection port through which the liquid is injected from an outside of the second tank; and
- an injection port cover portion to cover the injection port; and the injection port is located on one side in the third direction of the second tank.

10. The heat dissipation device according to claim 9, wherein the injection port cover portion includes:
- a water plug to plug the injection port; and
- a base to cover a periphery of the injection port.

11. The heat dissipation device according to claim 9, wherein the injection port cover portion covers the fixing assembly.

12. A cooling device comprising:
- the heat dissipation device according to claim 1;
- a cooling assembly to cool a heat source;
- a first pipe through which the liquid flows and which connects the pump assembly and the cooling assembly; and
- a second pipe through which the liquid flows and which connects the cooling assembly and the radiator.

* * * * *